United States Patent [19]

Buck et al.

[11] Patent Number: 4,957,583
[45] Date of Patent: Sep. 18, 1990

[54] APPARATUS FOR ETCHING PATTERNED SUBSTRATES

[75] Inventors: Roy V. Buck, Oak Ridge; Darrell P. Adams, Greensboro, both of N.C.

[73] Assignee: Analog Devices, Inc., Norwood, Mass.

[21] Appl. No.: 345,079

[22] Filed: Apr. 28, 1989

[51] Int. Cl.$^5$ .................. B44C 1/22; C23F 1/02; C03C 15/00; C03C 25/06
[52] U.S. Cl. .................. 156/345; 156/637; 156/639; 156/651; 156/652; 156/656; 156/659.1; 252/79.2
[58] Field of Search ............... 156/345, 626, 637, 639, 156/651, 652, 656, 659.1, 664; 252/79.2; 134/3

[56] References Cited

U.S. PATENT DOCUMENTS 3,411,999  11/1968  Weinberg ............... 156/637 X
3,745,079  7/1973   Cowles et al. .......... 156/637 X
4,440,594  4/1984   Stearns ................ 156/651 X Primary Examiner—William A. Powell
Attorney, Agent, or Firm—Wolf, Greenfield & Sacks

[57] ABSTRACT

A wet etching process wherein the etchant bath is ultrasonically vibrated, preferably while a carrier member holding the workpiece to be etched is slightly agitated. An apparatus for practicing the process includes a first vessel for holding a coupling fluid; a second vessel for holding an etchant solution; means for suspending the second vessel in the coupling fluid of the first vessel; and an ultrasonic generator means coupled to the first vessel to impart ultrasonic vibrations to the coupling fluid and, via the coupling fluid and second vessel, to the etchant solution.

3 Claims, 5 Drawing Sheets

APPARATUS FOR ETCHING PATTERNED SUBSTRATES

FIELD OF THE INVENTION

This invention relates to the field of semiconductor processing and, in particular, to wet chemical etching of patterned layers in integrated circuits. The process is particularly adapted for use in producing thin film resistors, but may be used for producing other structures and components, as well.

BACKGROUND OF THE INVENTION

In the field of integrated circuit fabrication, wet chemical etching processes are widely used, to selectively etch regions in the successive layers of an integrated circuit, to form electronic components and conductors from the various layers of materials. One problem which arises when such wet chemical etching is used is that the etchant solution often will, at the microscopic levels of interest, exhibit substantial non-uniformity of concentration. Localized regions of low chemical concentration of the etchant may occur due to low mobility of the active elements of the solution, causing so called "dead spots." These dead spots may also be the result of the etchant solution becoming saturated within localized regions. When this happens, the etching action is diminished in spots and overall is non uniform. One obvious way to increase local concentrations is to increase the overall concentration of the etchant solution. This, however, does not resolve the problem of non uniformity of concentration and may result in a solution which is so strong as to increase the etching rate in some areas to the point of producing undesireable effects, such as substantial undercutting of photoresist and resulting loss of control over geometrical considerations (e.g., line resolution and spacing). Another approach is to place in the etching bath a magnetic bead or beads which can be moved through the application of a magnetic field, to produce a stirring action. Magnetic bead stirring, though, creates vortices which aid macroscopic mixing without substantially changing the non-uniformity of etchant concentration at microscopic levels. Significant dead spots still result with magnetic bead stirring.

Accordingly, it is an object of the present invention to provide a method of wet chemical etching for use in integrated circuit fabrication, wherein dead spots are substantially alleviated.

Another object of the present invention is to provide a method of wet chemical etching for use in integrated circuit fabrication, to improve the uniformity of the etching rate over the surface of the material to be etched.

A further object of the invention is to provide a wet etching process which avoids undercutting photoresist or other materials.

Still another object of the invention is to provide a wet etching process which allows use of weaker etching solutions.

SUMMARY OF THE INVENTION

The foregoing and other objects of the invention, as will more fully appear from the detailed discussion below, are achieved in a wet etching process wherein the etchant bath is ultrasonically vibrated, preferably while a carrier member holding the workpiece to be etched is slightly agitated. For use in patterning thin film resistors by selective etching, a thin layer of a material such as Nichrome is formed on a substrate such as alumina; a photoresist is applied over the Nichrome; the photoresist is patterned; the workpiece is loaded into a carrier; the carrier is immersed into the etchant solution which has been ultrasonically activated for at least several minutes; and the carrier is (optionally) slightly agitated. When the Nichrome layer begins to turn a light gray (because the white color of the alumina is showing through), the carrier is removed from the bath and the carrier and workpiece are washed vigorously. The carrier is then placed back into the etchant solution. Upon removal of the last of the metallization layer, the carrier is removed from the etchant and washed again. An etching rate of about 15 Angstroms per second is achieved using Transene TFN Nichrome Etch Solution from Transene Co., Inc., of Rowley, Massachusetts, diluted with deionized water to a strength of about 2% ceric amonium nitrate and 0.7% nitric acid.

The invention further comprises an apparatus for practicing the process. The apparatus includes a first vessel for holding a coupling fluid; a second vessel for holding an etchant solution; means for suspending the second vessel in the coupling fluid of the first vessel; and an ultrasonic generator means coupled to the first vessel to impart ultrasonic vibrations to the coupling fluid and, via the coupling fluid and second vessel, to the etchant solution.

The invention will be more fully understood from the detailed description provided below, which should be read in conjunction with the drawing.

DETAILED DESCRIPTION

Figure 1:
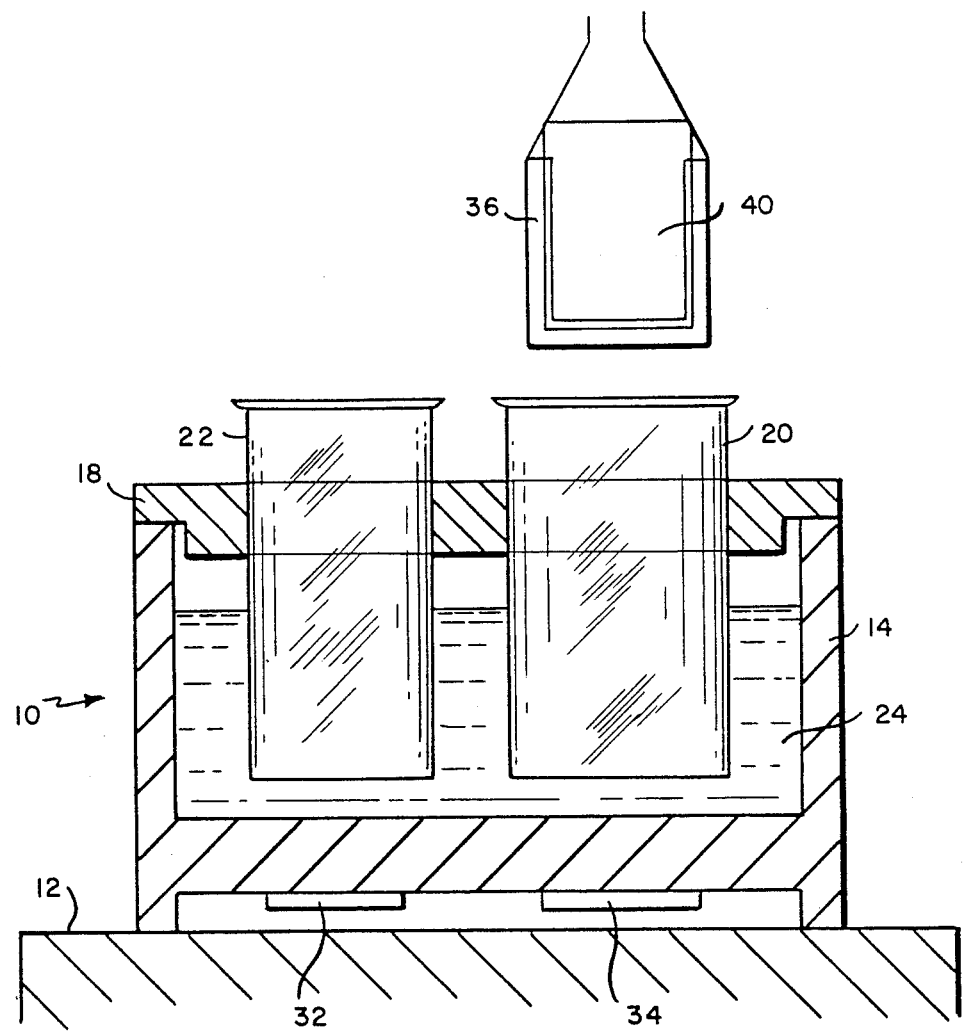
FIG. 1 is a cross-section of a diagrammatic illustration of an apparatus according to the present invention, for practicing the process of ultrasonically-enhanced etching.

FIG. 1 shows, in diagrammatic cross-section, an apparatus 10 according to the invention. The apparatus 10 sits on a workbench 12 and includes a stainless steel vessel 14, resting upon legs or stand 16. A plate 18, having a number of apertures for receiving beakers, such as the representative beakers 20 and 22, sits on top of the vessel 14. The plate 18 suspends the beakers about one half inch off the bottom of the vessel 14. Plate 18 may, in general, be a bracket or holder of any suitable type, and vessels of any shape and inert material may be substituted for the beakers. The interior of the vessel 14 may be fully or partially filled with deionized water or another suitable fluid 24; filling the vessel about half way has been found to be satisfactory. To the outside of the bottom of vessel 14 are fastened one or more ultrasonic transducers. Two 50-watt ultrasonic transducers 32 and 34 are indicated in the drawing; two other transducers have in practice been used, but for simplicity are not shown. The etchant solution is placed in beaker 20 and deionized water for rinsing is placed in beaker 22. A workpiece carrier 36 is shown for retaining a workpiece (i.e., substrate) 40, which is to be etched. Any suitable, industry-standard carrier may be used.

In the following example, the material to be etched is Nichrome and the etchant solution is Transene TFN Nichrome Etch Solution, which may be purchased from Transene Co., Inc., of Rowley, MA. From the vendor, this material is 16% ceric ammonium nitrate and 6% nitric acid. The commercial solution is diluted with deionized water to a strength of 2% ceric ammonium nitrate and about 0.75% nitric acid. Such dilution of the etchant is necessary in order to slow down the etching process so as to avoid over-etching, which could otherwise result from the increased etching rate caused by the use of the ultrasonic activation.

To prepare the etchant solution for use, the ultrasonic source (preferably) is activated for at least several minutes, to allow for cavitation and outgassing of the etchant solution.

Figure 2:
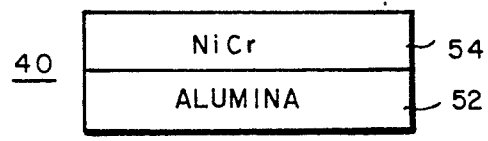
FIGS. 2-6 are a sequence of cross-sectional views showing an exemplary series of steps for creating thin-film resistors using wet-etching processes, both according to the prior art and according to the present invention.
Figure 3:
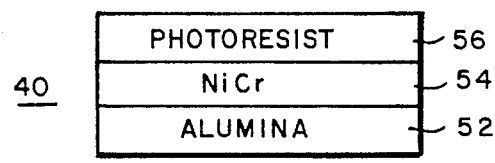
Figure 4:
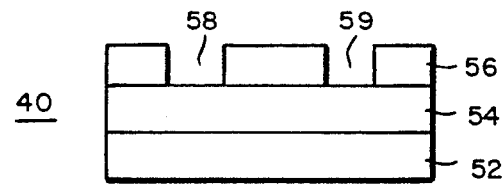
Figure 5:
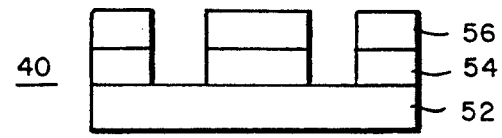
Figure 6:
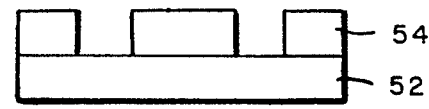

A workpiece (i.e., substrate carrying a thin-film Nichrome layer) to be etched is shown in FIG. 2. The workpiece 40 comprises an alumina substrate 52 on which has been deposited a layer 54 of Nichrome about 300-350 Angstroms thick. After the Nichrome layer is formed, a layer of photoresist 56 may be applied. FIG. 3. The photoresist may be patterned using conventional techniques to open up areas, such as 58 and 59, where the Nichrome is to be etched and to remain covering areas where Nichrome is to be retained. The workpiece 40 with the patterned photoresist is shown in FIG. 4. It is then placed in the carrier 36 for etching. Once the etching apparatus is ready, the workpiece 40 may be dipped into the etchant solution in beaker 20, to begin the etching process. The carrier which holds the workpiece may be slightly agitated by any convenient means. When the Nichrome layer begins to turn a light gray (meaning that the alumina substrate is starting to show through the Nichrome), the carrier 36 and workpiece 40 are removed from the etchant solution and are placed in the deionized water in rinse beaker 22, where they are thoroughly washed. When the washing is complete, the carrier and workpiece are then placed back into the etchant solution. When the last of the metallization has been removed by the etchant solution, the carrier is removed from the etchant solution and the workpiece is washed again in rinse beaker 22. This yields the workpiece as shown in FIG. 5. After the photoresist is removed, the workpiece is as appears in FIG. 6.

Figure 7:
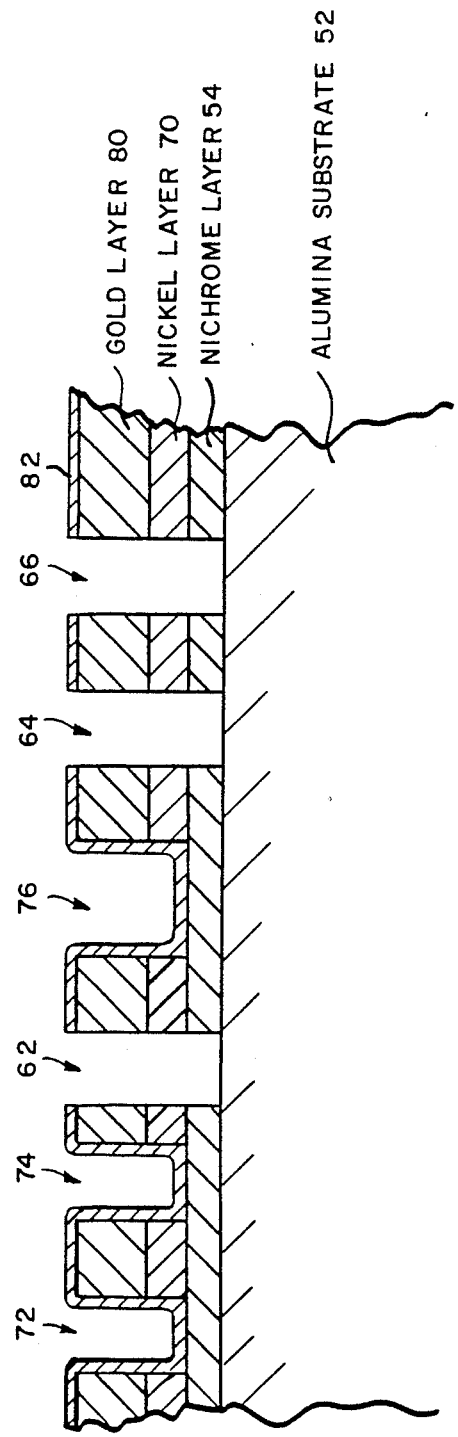
FIG. 7 is a cross-sectional view showing a multi-layer workpiece having thin-film resistors and gold circuit traces and which may be produced using wet-etching processes, both according to the prior art and according to the present invention.
Figure 8:
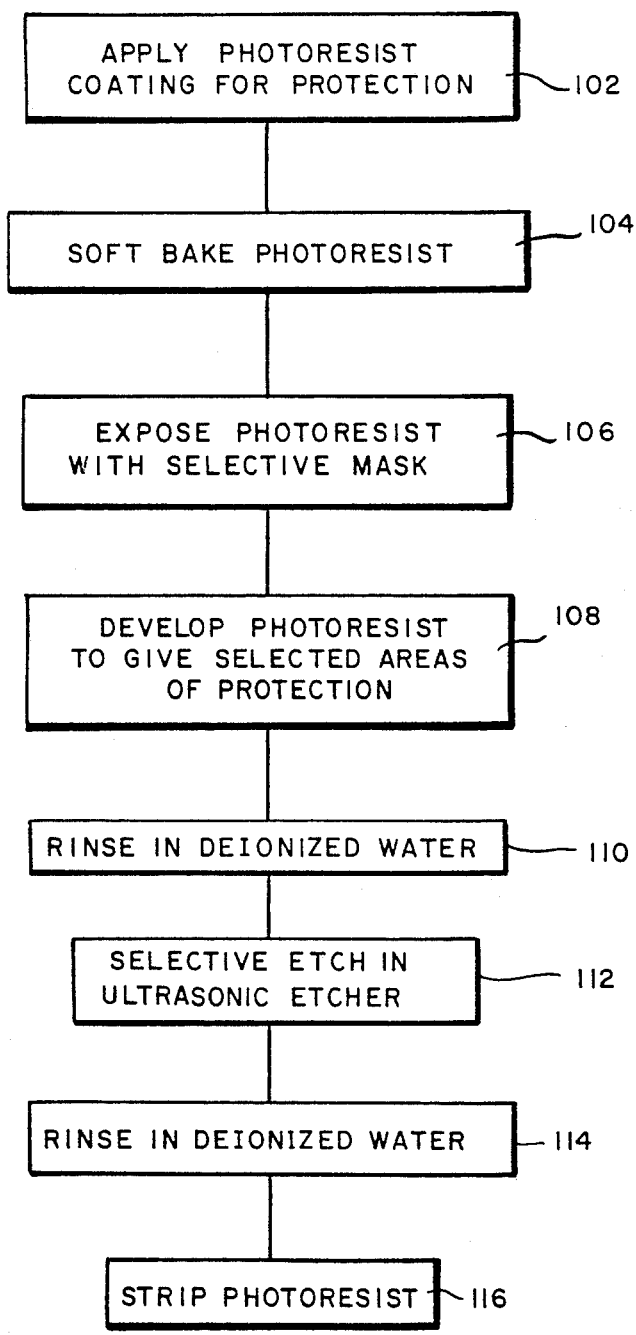
FIG. 8 is a flow chart of the basic ultrasonically-enhanced wet-etching process according to the present invention.

The same technique may be extended to the etching of successive layers and to etchings of other materials. For example, one typical grouping of layers would involve an aluminum substrate covered by successive layers of Nichrome, nickel and gold. An example is shown in FIG. 7. There, the substrate of alumina is indicated by reference numeral 52. A Nichrome layer 54 is formed directly on the substrate and is then covered by a layer of photoresist which is patterned to allow removal of the Nichrome by etching in areas 62, 64 and 66. The photoresist is then removed. A layer 70 of nickel is deposited over the Nichrome and a layer 80 of gold is then deposited immediately over the nickel. The nickel layer will typically be about three times as thick as the Nichrome layer; and the gold layer will typically be about 10-20 times as thick as the nickel layer. The purpose of the nickel layer is to serve as a mechanical barrier between the Nichrome and gold materials, to prevent gold from diffusing into the Nichrome, and vice versa. A layer of photoresist 82 is then applied over the gold layer. The photoresist 82 next is patterned to protect the areas where circuit traces will appear in the final product and to expose areas to be etched. The article (or workpiece) is then immersed in an ultrasonically activated etchant solution for gold, such as an approximately 17% cyanide solution. The etching process is complete when the black color of the nickel begins to become visible through the yellow color of the gold, at which time the article is removed from the etchant solution and immersed in the rinsing solution of deionized water. Next, using the same mask, the article is immersed in an ultrasonically activated etchant solution for nickel, such as a solution of about 16% nitric acid. A change of color cannot reliably be used as an indication of completion of the etching of the nickel, since the colors of nickel and Nichrome are fairly similar. Consequently, the nickel etching process may be timed experimentally, to determine completion. Fortunately, the etching rate of Nichrome using the nitric acid solution is much slower than that of nickel, so timing the reaction is a workable way of controlling the process. Further, one or more test resistors may be formed in the nickel layer, with the terminal points of the resistors spanning areas to be removed by etching. The resistance between pairs of terminal points may be checked periodically. When the etching is complete and the nickel has been fully removed to its full thickness, there will be a rapid and dramatic increase in the resistance values.

As with the prior two etches, the workpiece is promptly immersed in the deionized water rinsing solution and rinsed as soon as the etching process is completed.

Finally, the photoresist is removed.

For safety reasons, the etching solutions for the respective metal layers should be separated physically, to avoid unwanted chemical reactions. In particular, the potassium cyanide can react with the nitric acid to release a deadly cyanide gas.

The foregoing process is summarized in FIG. 7. First, photoresist is applied to protect the metal surface. Step 102. Next, the photoresist is subjected to an appropriate soft baking cure in a conventional way. Step 104. The photoresist is exposed using a selective mask. Step 106. The photoresist is then developed to give protection to selected areas. Step 108. Optionally, but preferably, the workpiece is next rinsed in deionized water. Step 110. It is then selectively etched in an ultrasonically activitated etching bath 112. The workpiece is removed from the etchant solution and rinsed in deionized water, step 114, upon completion of etching. Finally, the photoresist is removed. Step 116. Additional steps may be added, of course, for selective layers to be added and etched, as discussed above.

The ultrasonically enhanced wet etching process has been observed to result in improved yields of thin film resistors, the improvement being up to 10-20% in some cases. It also provides better control of resistor geometry and final resistor values. The use of weaker etching solution than has been customary yields minimal undercutting of photoresist and results in better resolution of conductor line widths. Of course, these improvements are a result of the overall improvement in the uniformity of the substrate etching process. Further, the use of weaker etching solutions results in a cost savings. Etching time is also reduced.

Having thus described the inventive concept and apparatus for practicing the invention, it will readily be seen that such apparatus is subject to numerous variations, and that the process may be varied in many respects without departing from the spirit of the invention. Various alterations, modifications, and improvements will readily occur to those skilled in the art and are intended to be suggested, though not expressly stated, by this disclosure. Accordingly, the foregoing discussion is presented by way of example only and is not intended to be limiting. The invention is limited only as defined in the following claims and equivalents thereto.

What is claimed is:

1. Apparatus for practicing the wet etching of a workpiece including a metallization layer on a substrate, comprising:
   a. a first vessel at least partially filled with a coupling fluid;
   b. a second vessel containing an etchant solution and having an aperture large enough to receive the workpiece therein;
   c. means for suspending the second vessel in the coupling fluid of the first vessel;
   d. an ultrasonic generator means coupled to the first vessel to impart ultrasonic vibrations to the coupling fluid and, via the coupling fluid and second vessel, to the etchant solution; and
   e. means for vibrating the workpiece when said workpiece is disposed in said second vessel and said second vessel is disposed in said first vessel.

2. Apparatus for practicing the wet etching of a workpiece including a metallization layer on a substrate, comprising:
   a. a first vessel at least partially filled with a coupling fluid;
   b. a second vessel containing an etchant solution and having an aperture large enough to receive the workpiece therein;
   c. a third vessel containing a washing solution and having an aperture large enough to receive the workpiece therein;
   d. means for suspending the second and third vessels in the coupling fluid of the first vessel; and
   e. an ultrasonic generator means coupled to the first vessel to impart ultrasonic vibrations to the coupling fluid and, via the coupling fluid and second vessel to the etchant, and via the coupling fluid and the third vessel to the washing solution.

3. An apparatus as recited in claim 2, wherein said washing solution is deionized water.

* * * * *